(12) United States Patent
Yamaguchi

(10) Patent No.: US 10,618,140 B2
(45) Date of Patent: Apr. 14, 2020

(54) SUBSTRATE PROCESSING SYSTEM AND SUBSTRATE PROCESSING METHOD

(71) Applicant: Ebara Corporation, Tokyo (JP)

(72) Inventor: Kuniaki Yamaguchi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 354 days.

(21) Appl. No.: 15/122,975

(22) PCT Filed: Mar. 4, 2015

(86) PCT No.: PCT/JP2015/056341
§ 371 (c)(1),
(2) Date: Sep. 1, 2016

(87) PCT Pub. No.: WO2015/133516
PCT Pub. Date: Sep. 11, 2015

(65) Prior Publication Data
US 2017/0066101 A1   Mar. 9, 2017

(30) Foreign Application Priority Data
Mar. 7, 2014 (JP) .................................. 2014-045172

(51) Int. Cl.
*B24B 57/02* (2006.01)
*B24B 37/005* (2012.01)
(Continued)

(52) U.S. Cl.
CPC ............ *B24B 37/005* (2013.01); *B24B 37/00* (2013.01); *B24B 37/20* (2013.01); *B24B 57/02* (2013.01);
(Continued)

(58) Field of Classification Search
CPC ..... B24B 37/005; B24B 37/013; B24B 57/00; B24B 57/02
See application file for complete search history.

(56) References Cited

U.S. PATENT DOCUMENTS 5,797,789 A * 8/1998 Tanaka .................... B24B 37/04
451/205
5,836,805 A   11/1998 Obeng
(Continued)

FOREIGN PATENT DOCUMENTS

CN   1713967 A   12/2005
CN   101276742 A   10/2008
(Continued)

OTHER PUBLICATIONS

International Search Report issued in Application No. PCT/JP2015/056341 dated Apr. 7, 2015.

*Primary Examiner* — Timothy V Eley
*Assistant Examiner* — Marcel T Dion
(74) *Attorney, Agent, or Firm* — Pearne & Gordon LLP

(57) ABSTRACT

The present invention relates to a substrate processing system and a substrate processing method capable of cleaning a processing-liquid supply line. A substrate processing system includes: a substrate processing apparatus (1) configured to process a substrate W; and a flushing device for cleaning a distribution line (93) and a processing-liquid supply line (92). The flushing device includes: a cleaning-liquid supply line (99) coupled to the distribution line (93); a drain mechanism (101) configured to direct a cleaning liquid, supplied into the processing-liquid supply line (92) through the distribution line (93), to a liquid disposal area (100); a supply switching valve (104) configured to allow only the processing liquid or the cleaning liquid to flow in the distribution line (93); and an operation controller (30) configured to control operations of the drain mechanism (101) and the supply switching valve (104).

27 Claims, 11 Drawing Sheets

(51) Int. Cl.
*B24B 37/00* (2012.01)
*H01L 21/67* (2006.01)
*H01L 21/687* (2006.01)
*B24B 37/20* (2012.01)
*H01L 21/02* (2006.01)

(52) U.S. Cl.
CPC .. *H01L 21/02035* (2013.01); *H01L 21/02052* (2013.01); *H01L 21/67017* (2013.01); *H01L 21/67046* (2013.01); *H01L 21/67051* (2013.01); *H01L 21/67219* (2013.01); *H01L 21/68728* (2013.01)

(56) References Cited

U.S. PATENT DOCUMENTS

| | | | | |
|---|---|---|---|---|
| 6,086,454 | A * | 7/2000 | Watanabe | B24B 37/04 451/36 |
| 2002/0061722 | A1 | 5/2002 | Kondo | |
| 2002/0127860 | A1 * | 9/2002 | Vanell | B24B 37/04 438/689 |
| 2003/0220708 | A1 * | 11/2003 | Sahin | H01L 21/67253 700/121 |
| 2007/0232203 | A1 * | 10/2007 | Fukuda | B08B 1/04 451/287 |
| 2007/0295063 | A1 * | 12/2007 | Cho | B24B 57/02 73/61.71 |
| 2008/0139087 | A1 * | 6/2008 | Togawa | B24B 37/013 451/8 |
| 2011/0070811 | A1 * | 3/2011 | Neuber | B24B 37/04 451/60 |
| 2014/0220864 | A1 * | 8/2014 | Kawahara | B24B 37/345 451/24 |

FOREIGN PATENT DOCUMENTS

| | | |
|---|---|---|
| JP | 2000-202765 A | 7/2000 |
| JP | 2000-280170 A | 10/2000 |
| JP | 2002-154057 A | 5/2002 |
| JP | 2003-142442 A | 5/2003 |
| JP | 2004-358587 A | 12/2004 |
| JP | 2007-229845 A | 9/2007 |
| JP | 2008-036744 A | 2/2008 |
| JP | 2009-135174 A | 6/2009 |
| JP | 2013-169620 A | 9/2013 |
| JP | 2013-215409 A | 10/2013 |
| WO | 2004/113023 A1 | 12/2004 |

\* cited by examiner

SUBSTRATE PROCESSING SYSTEM AND SUBSTRATE PROCESSING METHOD

TECHNICAL FIELD

The present invention relates to a substrate processing system and a substrate processing method for processing a substrate, such as a wafer, and more particularly to a substrate processing system and a substrate processing method capable of processing the substrate using a processing liquid and further cleaning a processing-liquid supply line.

BACKGROUND ART

A plurality of substrate processing apparatuses for polishing and cleaning wafers are installed in a manufacturing factory for semiconductor devices. In the manufacturing factory in recent year, a central supply system is employed for distributing a processing liquid, such as a polishing liquid or a chemical liquid, to the substrate processing apparatuses. In this central supply system, the processing liquid circulates through a circulation line installed in the manufacturing factory, and supplies the processing liquid to the substrate processing apparatuses through branch lines extending from the circulation line.

The processing liquid that has been supplied to the substrate processing apparatus continues to flow in the substrate processing apparatus as long as a wafer is being processed (i.e., polished and cleaned). However, when processing of a wafer is not performed, the processing liquid stays in a pipe installed in the substrate processing apparatus. If processing of a wafer is not performed for a long time, the processing liquid sinks in the pipe. As a result, a concentration distribution of the processing liquid may change, or particles, such as abrasive grains, contained in the processing liquid may condense into large particles (which will be hereinafter referred to as coarse particles). The processing liquid, whose concentration distribution has changed, may cause an adverse influence on a substrate processing result. Moreover, if the coarse particles are brought into contact with a wafer during processing of the wafer, scratches may be caused on a surface of the wafer.

CITATION LIST

Patent Literature

Patent document 1: Japanese laid-open patent publication No. 2007-229845
Patent document 2: Japanese laid-open patent publication No. 9-29637
Patent document 3: Japanese laid-open patent publication No. 2004-358587
Patent document 4: Japanese laid-open patent publication No. 2000-280170
Patent document 5: Japanese laid-open patent publication No. 2002-154057

SUMMARY OF INVENTION

Technical Problem

The present invention has been made in view of the above conventional drawback. It is therefore an object of the present invention to provide a substrate processing system and a substrate processing method which are capable of processing a substrate, such as a wafer, while directly or indirectly supplying a processing liquid, which can exhibit its original property, onto the substrate.

Solution to Problem

In one aspect of the present invention, there is provided a substrate processing system comprising: a substrate processing apparatus configured to process a substrate while directly or indirectly supplying a processing liquid from a processing-liquid supply nozzle onto the substrate, the processing-liquid supply nozzle being coupled to a processing-liquid supply line; a distribution line that couples the processing-liquid supply line to a processing-liquid supply source; and a flushing device configured to clean the distribution line and the processing-liquid supply line, the flushing device including: a cleaning-liquid supply line coupled to the distribution line; a drain mechanism configured to direct a cleaning liquid, supplied into the processing-liquid supply line through the distribution line, to a liquid disposal area; a supply switching valve attached to the distribution line and the cleaning-liquid supply line, the supply switching valve being configured to allow only the processing liquid or the cleaning liquid to flow into the distribution line; and an operation controller configured to control operations of the drain mechanism and the supply switching valve, wherein the distribution line and the supply switching valve are located outside the substrate processing apparatus.

In a preferred aspect of the present invention, the drain mechanism comprises a drain line which branches off from the processing-liquid supply line and extends to the liquid disposal area, and a drain switching valve attached to the processing-liquid supply line and the drain line, the drain switching valve being configured to direct the cleaning liquid, flowing in the processing-liquid supply line, to the drain line.

In a preferred aspect of the present invention, the drain switching valve is located right upstream of the processing-liquid supply nozzle.

In a preferred aspect of the present invention, the drain mechanism comprises a nozzle moving mechanism configured to move the processing-liquid supply nozzle from a predetermined position for processing the substrate to a position above the liquid disposal area.

In a preferred aspect of the present invention, the operation controller is configured to operate the supply switching valve before processing of the substrate to pass the cleaning liquid into the processing-liquid supply line.

In a preferred aspect of the present invention, the operation controller is configured to operate the supply switching valve and the drain mechanism to direct the cleaning liquid to the liquid disposal area while passing the cleaning liquid into the processing-liquid supply line when an operation time of the substrate processing apparatus has reached a predetermined time.

In a preferred aspect of the present invention, the substrate processing system further comprises a particle measuring device configured to count particles contained in the processing liquid per unit volume.

In a preferred aspect of the present invention, the operation controller is configured to emit an alarm or stop an operation of the substrate processing apparatus if the number of particles has reached a predetermined threshold value.

In a preferred aspect of the present invention, the operation controller is configured to operate the supply switching valve to cause the cleaning liquid to flow through the distribution line into the processing-liquid supply line and operate the drain mechanism to direct the cleaning liquid, supplied in the processing-liquid supply line, to the liquid disposal area, if the number of particles has reached a predetermined threshold value.

In a preferred aspect of the present invention, the substrate processing system further comprises a filter for capturing the particles contained in the processing liquid, the particle measuring device being located downstream of the filter.

In a preferred aspect of the present invention, the operation controller is configured to emit an alarm prompting a replacement of the filter if the number of particles has reached a predetermined threshold value.

In a preferred aspect of the present invention, the substrate processing system further comprises a film-thickness measuring device configured to measure a film thickness of the substrate, wherein the operation controller is configured to operate the supply switching valve to cause the cleaning liquid to flow through the distribution line into the processing-liquid supply line and operate the drain mechanism to direct the cleaning liquid, supplied in the processing-liquid supply line, to the liquid disposal area, if a measurement value of the film thickness is out of a predetermined allowable range.

In a preferred aspect of the present invention, the substrate processing system further comprises a substrate inspection device configured to detect a defect of the substrate, wherein the operation controller is configured to operate the supply switching valve to cause the cleaning liquid to flow through the distribution line into the processing-liquid supply line and operate the drain mechanism to direct the cleaning liquid, supplied in the processing-liquid supply line, to the liquid disposal area, if the number of detected defects has reached a predetermined threshold value.

In another aspect of the present invention, there is provided a substrate processing method comprising: cleaning a distribution line and a processing-liquid supply line by flushing a cleaning liquid through the distribution line into the processing-liquid supply line which is installed in a substrate processing apparatus, while directing the cleaning liquid, which has been supplied into the processing-liquid supply line, to a liquid disposal area; and processing a substrate in the substrate processing apparatus while supplying directly or indirectly a processing liquid onto the substrate through the processing-liquid supply line.

In a preferred aspect of the present invention, the substrate processing method further comprises washing out a processing liquid remaining in the distribution line and directing the processing liquid to the liquid disposal area by supplying a fresh processing liquid into the distribution line.

In a preferred aspect of the present invention, the substrate processing method further comprises measuring the number of particles contained in the processing liquid per unit volume.

In a preferred aspect of the present invention, if the number of particles has reached a predetermined threshold value, emitting an alarm or stopping an operation of the substrate processing apparatus.

In a preferred aspect of the present invention, the substrate processing method further comprises if the number of particles has reached a predetermined threshold value, performing again the process of cleaning the distribution line and the processing-liquid supply line by flushing the cleaning liquid through the distribution line into the processing-liquid supply line while directing the cleaning liquid to the liquid disposal area.

In a preferred aspect of the present invention, the substrate processing method further comprises if the number of particles has reached a predetermined threshold value, emitting an alarm for prompting an replacement of a filter attached to the distribution line or the processing-liquid supply line.

In a preferred aspect of the present invention, the substrate processing method further comprises: measuring a film thickness of the substrate; and if a measurement value of the film thickness is out of a predetermined allowable range, performing again the process of cleaning the distribution line and the processing-liquid supply line by flushing the cleaning liquid through the distribution line into the processing-liquid supply line while directing the cleaning liquid to the liquid disposal area.

In a preferred aspect of the present invention, the substrate processing method further comprises: detecting a defect of the substrate; and if the number of detected defects has reached a predetermined threshold value, performing again the process of cleaning the distribution line and the processing-liquid supply line by flushing the cleaning liquid through the distribution line into the processing-liquid supply line while directing the cleaning liquid to the liquid disposal area.

In a preferred aspect of the present invention, when an operation time of the substrate processing apparatus has reached a predetermined time, performing the process of cleaning the distribution line and the processing-liquid supply line by flushing the cleaning liquid through the distribution line into the processing-liquid supply line while directing the cleaning liquid, supplied into the processing-liquid supply line, to the liquid disposal area.

Advantageous Effects of Invention

The cleaning liquid flows in the distribution line and the processing-liquid supply line, thereby washing away a deteriorated processing liquid remaining in the distribution line and the processing-liquid supply line. The cleaning liquid, together with the processing liquid, is directed to the liquid disposal area by the drain mechanism, and is drained into the liquid disposal area. Therefore, the cleaning liquid and the deteriorated processing liquid are not supplied onto a substrate, and do not adversely affect processing of the substrate. After the distribution line and the processing-liquid supply line are cleaned with the cleaning liquid, a processing liquid, which can exhibit its original property, is directly or indirectly supplied onto a substrate. Therefore, processing of the substrate can be performed properly.

DESCRIPTION OF EMBODIMENTS

Figure 1:
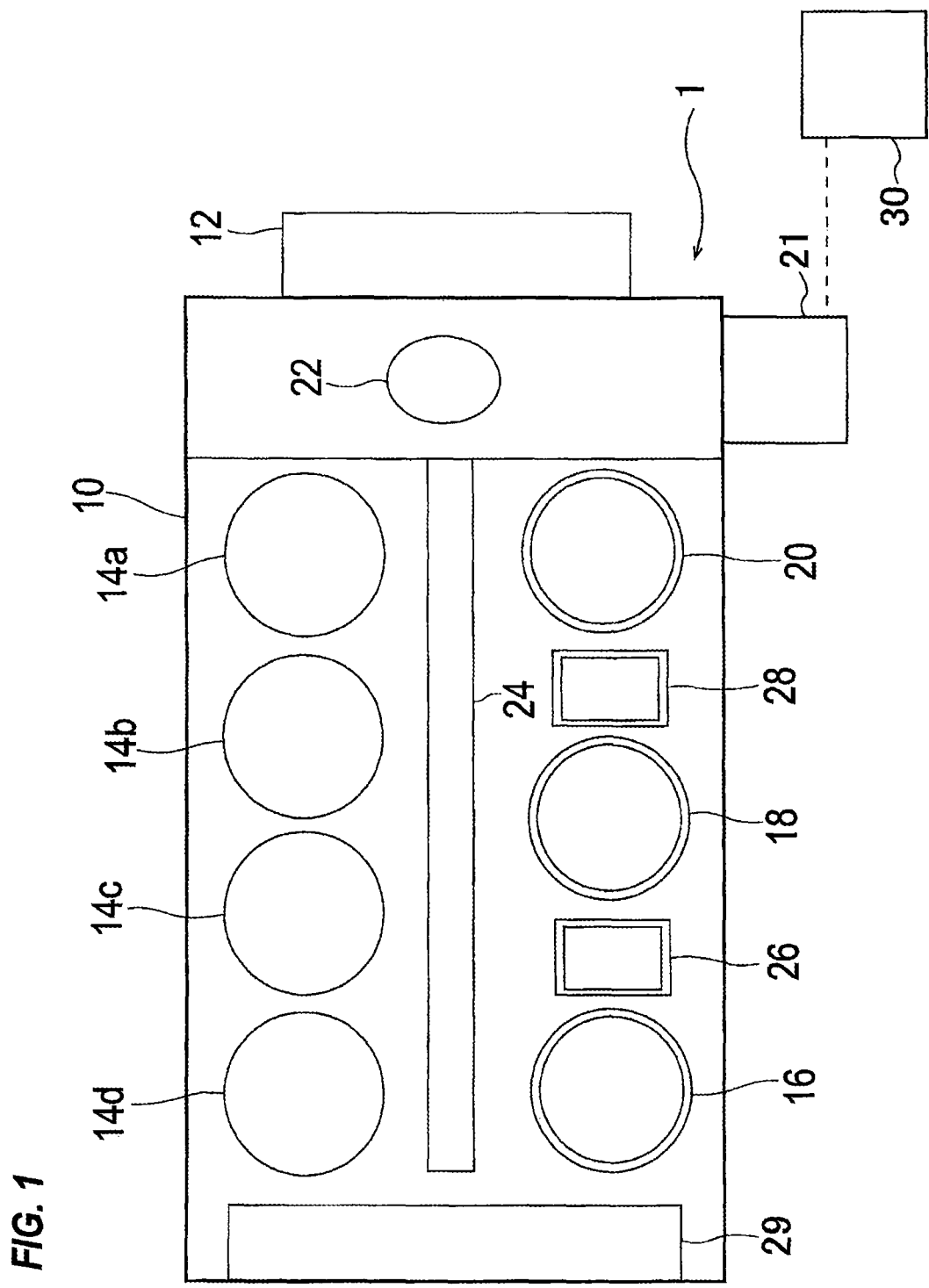
FIG. 1 is a plan view showing an embodiment of a substrate processing apparatus.

Embodiments will now be described with reference to the drawings. The same or corresponding structural elements are denoted by the same reference numerals in FIGS. 1 through 11, and repetitive descriptions will be omitted.

FIG. 1 is a plan view showing an embodiment of a substrate processing apparatus 1. This substrate processing apparatus 1 is a composite apparatus capable of performing a plurality of processes including polishing, cleaning, and drying of a substrate, such as a wafer. As shown in FIG. 1, the substrate processing apparatus 1 includes a housing 10 in an approximately rectangular form, and a loading port 12 on which a substrate cassette is placed. The substrate cassette can house a large number of wafers therein. The loading port 12 is disposed adjacent to the housing 10. The loading port 12 can receive thereon an open cassette, a SMIF (Standard Manufacturing Interface) pod, or a FOUP (Front Opening Unified Pod). Each of the SMIF and the FOUP is an airtight container which houses a substrate cassette therein and which, by covering it with a partition wall, can keep its internal environment isolated from an external environment.

In the housing 10, there are disposed a plurality of (four in this embodiment) polishing units 14a, 14b, 14c, 14d each for cleaning a wafer, a first cleaning unit 16 and a second cleaning unit 18 each for cleaning a polished wafer, and a drying unit 20 for drying a cleaned wafer. The polishing units 14a to 14d are arranged along a longitudinal direction of the substrate processing apparatus 1. The cleaning units 16, 18 and the drying unit 20 are also arranged along the longitudinal direction of the substrate processing apparatus 1.

A first substrate transfer robot 22 is disposed in an area surrounded by the loading port 12, the polishing unit 14a, and the drying unit 20. A substrate transport unit 24 is disposed parallel to the polishing units 14a to 14d. The first substrate transfer robot 22 receives a wafer, to be polished, from the loading port 12 and transfers the wafer to the substrate transport unit 24. Further, the first substrate transfer robot 22 receives a dried wafer from the drying unit 20 and returns the dried wafer to the loading port 12. The substrate transport unit 24 transports a wafer, received from the first substrate transfer robot 22, to the polishing units 14a, 14b, 14c, 14d, and receives the wafer from the polishing units 14a, 14b, 14c, 14d. Each of the polishing units 14a to 14d is configured to polish a surface of a wafer by rubbing the wafer against a polishing surface while supplying a polishing liquid (or slurry) onto the polishing surface.

A second substrate transfer robot 26 for transporting a wafer between the cleaning units 16, 18 and the substrate transport unit 24 is disposed between the first cleaning unit 16 and the second cleaning unit 18. A third substrate transfer robot 28 for transporting a wafer between the second cleaning unit 18 and the drying unit 20 is provided between these units 18, 20. Further, a processing controller 29 for controlling operations of each of the units of the substrate processing apparatus 1 is provided in the housing 10.

Each of the first cleaning unit 16 and the second cleaning unit 18 is a first cleaning unit 16 for cleaning a wafer by scrubbing both a front surface and a back surface of the wafer with roll sponges in the presence of a chemical liquid. The second cleaning unit 18 may be a cleaning device for scrubbing a wafer with a pen-type sponge in the presence of a chemical liquid. The dry unit 20 is a spin-drying device configured to eject IPA vapor from a moving nozzle to dry a wafer and further dry the wafer by rotating the wafer at a high speed.

The wafer is polished by at least one of the polishing units 14a to 14d. The polished wafer is cleaned by the first cleaning unit 16 and the second cleaning unit 18, and the cleaned wafer is then dried by the drying unit 20.

The wafer that has been dried by the drying unit 20 is transported to a film-thickness measuring device 21 by the first substrate transfer robot 22. The film-thickness measuring device 21 is configured to measure a film thickness of the wafer. After measuring of the film thickness, the first substrate transfer robot 22 removes the wafer from the film-thickness measuring device 21, and returns it to the loading port 12.

Figure 2:
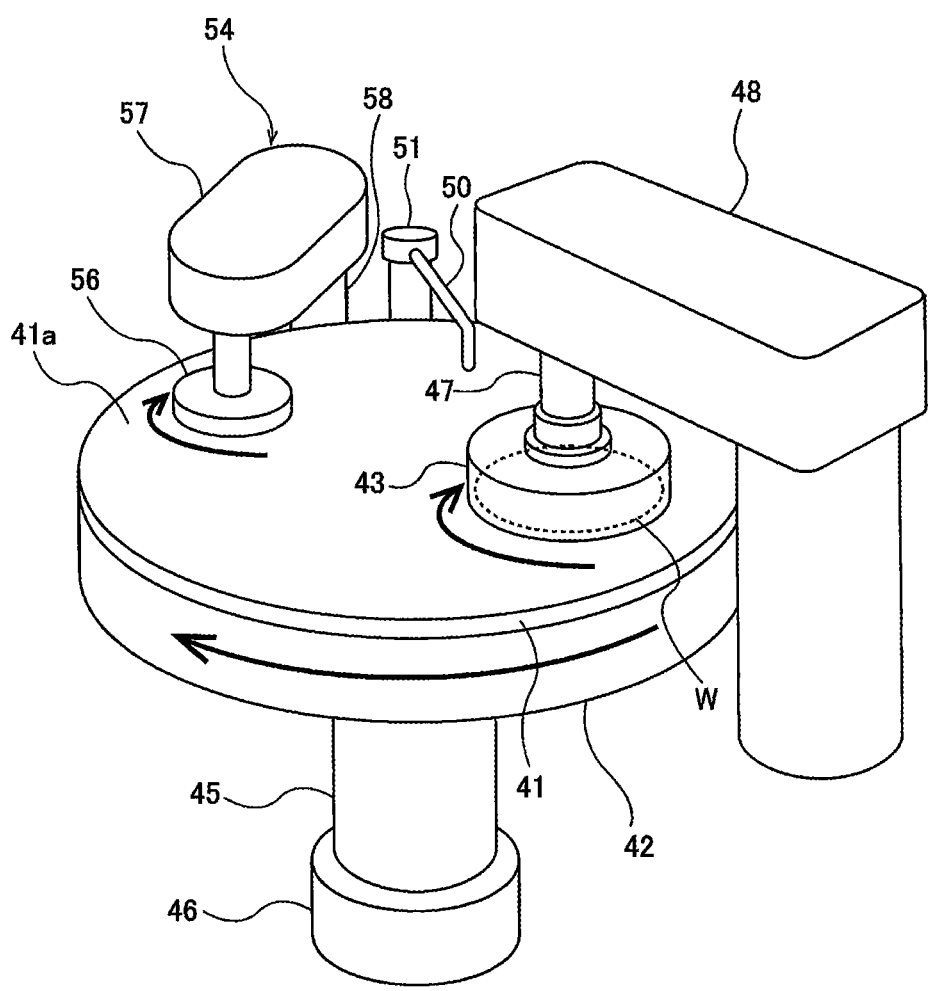
FIG. 2 is a perspective view of a polishing unit which is incorporated in the substrate processing apparatus shown in FIG. 1.

The polishing units 14a, 14b, 14c, 14d have the same structure. Accordingly, the polishing unit 14a will be described below. FIG. 2 is a perspective view of the polishing unit 14a which is incorporated in the substrate processing apparatus 1. As shown in FIG. 2, the polishing unit 14a includes a polishing table 42 for supporting a polishing pad 41 thereon, a top ring 43 configured to press a wafer W, which is an example of a substrate, against the polishing pad 41, and a polishing-liquid supply nozzle 50 configured to supply a polishing liquid onto the polishing pad 41.

The polishing table 42 is coupled to a table motor 46 through a table shaft 45, so that the polishing table 42 is rotated by the table motor 46 in a direction indicated by arrow. The table motor 46 is located below the polishing table 42. The polishing pad 41 is attached to an upper surface of the polishing table 42. The polishing pad 41 has an upper surface which provides a polishing surface 41a for polishing the wafer W. The top ring 43 is secured to a lower end of a top ring shaft 47. The top ring 43 is configured to be able to hold the wafer W by vacuum suction on a lower surface thereof. The top ring shaft 47 is coupled to a non-illustrated rotating device provided in a top ring arm 48, so that the top ring 43 is rotated by the rotating device through the top ring shaft 47. The top ring 43 is a substrate holder for holding and rotating the wafer W.

Figure 3:
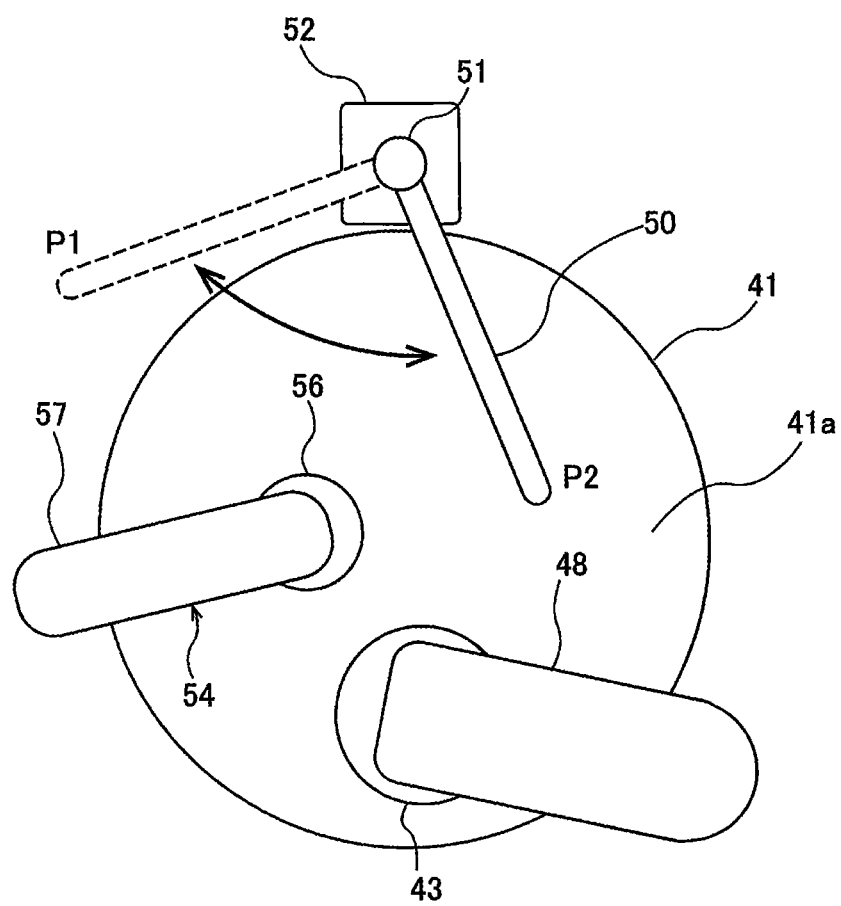
FIG. 3 is a plan view of the polishing unit shown in FIG. 2.

FIG. 3 is a plan view of the polishing unit 14a shown in FIG. 2. As shown in FIG. 3, the polishing-liquid supply nozzle 50 is secured to a nozzle pivot shaft 51, and is configured to be able to pivot around the nozzle pivot shaft 51. The nozzle pivot shaft 51 is coupled to a nozzle motor 52 serving as a nozzle moving mechanism, which allows the polishing-liquid supply nozzle 50 to be movable between a retreat position P1 outside the polishing pad 41 and a processing position P2 above the polishing pad 41.

Polishing of the wafer W is performed as follows. The top ring 43 and the polishing table 42 are rotated in respective directions indicated by arrows in FIG. 2. In this state, the top ring 43 presses the wafer W against the polishing surface 41a of the polishing pad 41, while the polishing-liquid supply nozzle 50, which is located at the processing position P2, supplies the polishing liquid onto the polishing surface 41a of the polishing pad 41. The wafer W is rubbed against the polishing pad 41 in the presence of the polishing liquid held on the polishing surface 41a. The surface of the wafer W is polished by a mechanical action of abrasive grains contained in the polishing liquid and a chemical action of a chemical component of the polishing liquid.

The polishing unit 14a further includes a dressing device 54 for dressing the polishing pad 41. The dressing device 54 includes a dresser 56 which is brought into contact with the polishing surface 41a of the polishing pad 41, a dresser arm 57 supporting the dresser 56, and a dresser pivot shaft 58 for causing the dresser arm 57 to pivot. The dresser 56 is configured to be rotated by a non-illustrated motor installed in the dresser arm 57. The dresser 56 has a lower surface serving as a dressing surface constituted by a large number of abrasive grains, such as diamond particles.

Dressing of the polishing pad 41 is performed after polishing of the wafer W. Specifically, after polishing of the wafer W is performed, the top ring 43, which is holding the wafer W, is moved outwardly of the polishing table 42. Subsequently, the dresser 56, while rotating about its own axis, is pressed against the polishing surface 41a of the polishing pad 41. In this state, the dresser 56 oscillates on the polishing surface 41a as the dresser arm 57 pivots. The dresser 56 scrapes away the polishing pad 41 slightly, thereby dressing the polishing surface 41a. During dressing of the polishing pad 41, pure water, instead of the polishing liquid, is supplied from the polishing-liquid supply nozzle 50 onto the polishing pad 41.

Figure 4:
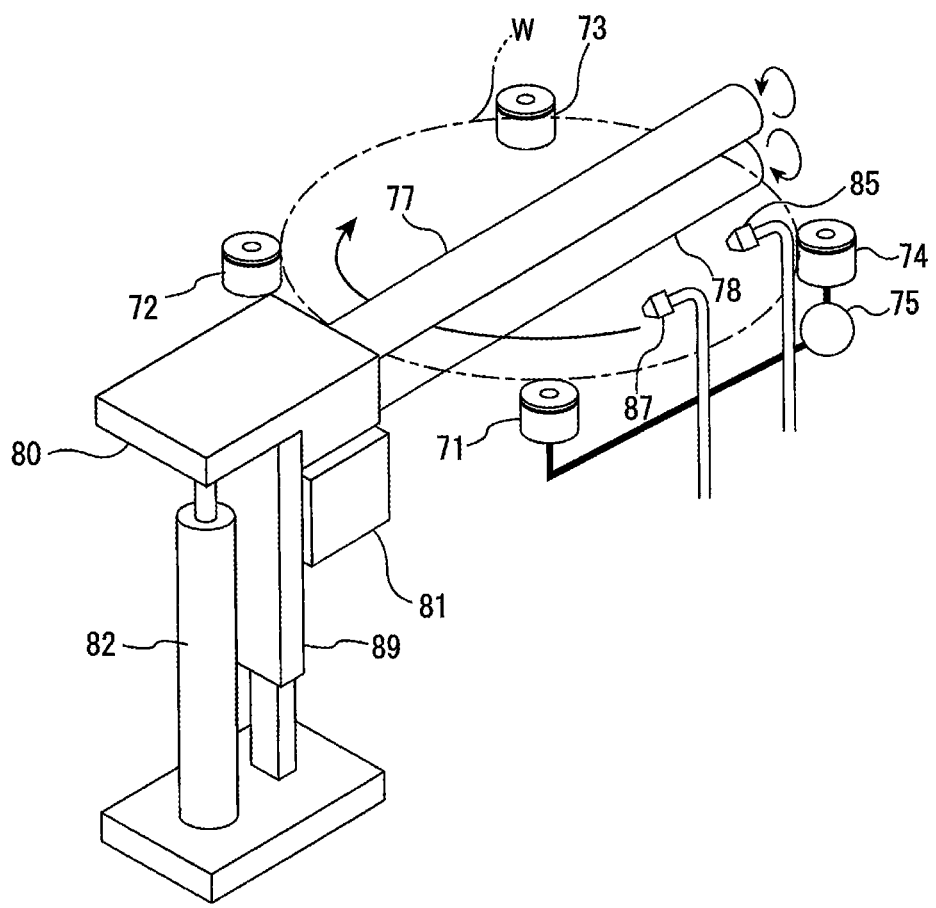
FIG. 4 is a perspective view showing a cleaning unit which is incorporated in the substrate processing apparatus shown in FIG. 1.

FIG. 4 is a perspective view showing the first cleaning unit 16. In this embodiment, horizontally-extending roll sponges are used as sponge cleaning tools for cleaning the wafer W. The first cleaning unit 16 includes four holding rollers 71, 72, 73, 74 for holding and rotating the wafer W, roll sponges 77, 78 in a cylindrical shape which are brought into contact with an upper surface and a lower surface of the wafer W, respectively, cleaning-tool rotating devices 80, 81 for rotating these roll sponges 77, 78 about their respective own axes, an upper rinsing liquid supply nozzle 85 for supplying a rinsing liquid (e.g., pure water) onto the upper surface of the wafer W, and an upper chemical liquid supply nozzle 87 for supplying a chemical liquid onto the upper surface of the wafer W. Although not shown in the drawings, a lower rinsing liquid supply nozzle for supplying a rinsing liquid (e.g., pure water) onto the lower surface of the wafer W and a lower chemical liquid supply nozzle for supplying a chemical liquid onto the lower surface of the wafer W are provided. An example of the chemical liquid used is an etching liquid having an etching action on a thin film that forms the surface of the wafer W.

The holding rollers 71, 72, 73, 74 constitute a substrate holder for holding and rotating the wafer W. The holding rollers 71, 72, 73, 74 are movable in directions closer to and away from the wafer W by a non-illustrated actuator (e.g., an air cylinder). Two holding rollers 71, 74 of four holding rollers are coupled to a substrate rotating device 75, so that the holding rollers 71, 74 are rotated in the same directions by the substrate rotating device 75. When the two holding rollers 71, 74 are rotated while the four holding rollers 71, 72, 73, 74 are holding the wafer W, the wafer W is rotated about its own axis.

The cleaning-tool rotating device 80 for rotating the upper roll sponge 77 is attached to a guide rail 89 which guides a vertical movement of the cleaning-tool rotating device 80. This cleaning-tool rotating device 80 is further supported by an elevating mechanism 82, so that the cleaning-tool rotating device 80 and the upper roll sponge 77 are moved up and down by the elevating mechanism 82.

Although not shown in the drawings, the cleaning-tool rotating device 81 for rotating the lower roll sponge 78 is supported by a guide rail, and the cleaning-tool rotating device 81 and the lower roll sponge 78 are moved up and down by an elevating mechanism. The elevating mechanism may be a motor-drive actuator using a ball screw, an air cylinder, or the like. When cleaning the wafer W is to be performed, the roll sponges 77, 78 are moved in directions closer to each other until the roll sponges 77, 78 are brought into contact with the upper and lower surfaces of the wafer W, respectively.

Next, a process of cleaning the wafer will be described. First, the wafer W is rotated about its own axis by the holding rollers 71, 72, 73, 74. Next, the upper chemical liquid supply nozzle 87 and the lower chemical liquid supply nozzle (not shown) supply the chemical liquid onto the upper surface and the lower surface of the wafer W, respectively. In this state, the roll sponges 77, 78 are brought into sliding contact with the upper and lower surfaces of the wafer W while being rotated about their horizontally-extending axes, thereby scrub-cleaning the upper and lower surfaces of the wafer W. Each of the roll sponges 77, 78 has a length longer than a diameter of the wafer W, so that the roll sponges 77, 78 can touch the entireties of the upper and lower surfaces of the wafer W. After scrub-cleaning, while the roll sponges 77, 78 are rubbing against the upper and lower surfaces of the wafer W, the rinsing liquid is supplied onto the upper surface and the lower surface of the rotating wafer W, thereby rinsing the wafer W.

As described above, the polishing units 14a to 14d and the cleaning units 16, 18 are processing units each for processing a wafer while supplying a processing liquid onto the wafer. Specifically, each of the polishing units 14a to 14d is configured to polish a wafer while indirectly supplying the polishing liquid to the wafer through the polishing pad 41. Each of the cleaning units 16, 18 is configured to clean a wafer while directly supplying the chemical liquid onto the wafer. Hereinafter, the polishing units 14a to 14d and the cleaning units 16, 18 are collectively referred to as processing unit, and the polishing liquid (slurry) and the chemical liquid are collectively referred to as processing liquid.

Figure 5:
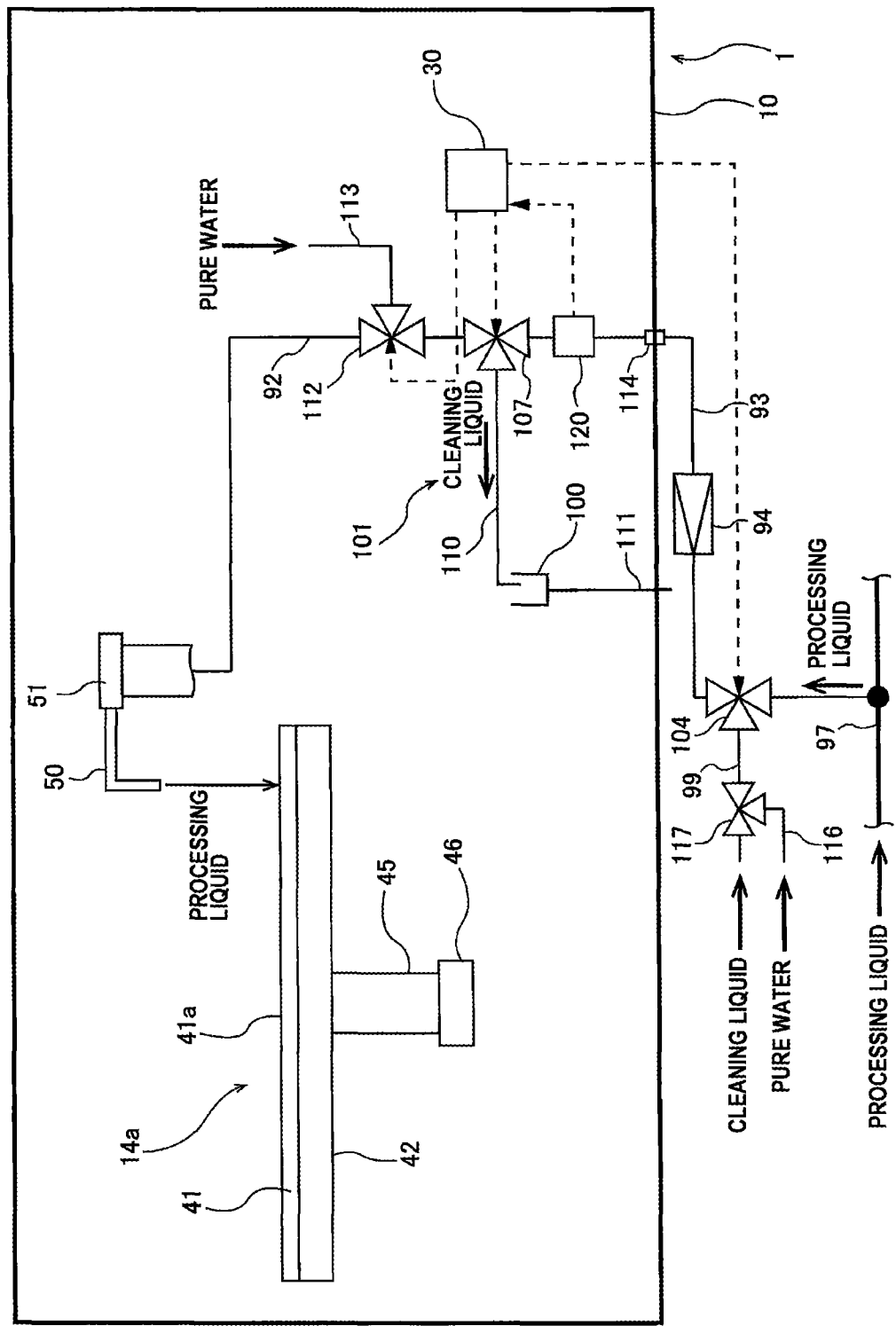
FIG. 5 is a schematic view showing a processing-liquid supply line for supplying a processing liquid to a processing unit and a flushing device for cleaning the processing-liquid supply line.

FIG. 5 is a schematic view showing a processing-liquid supply line 92 for supplying the processing liquid to the processing unit and a flushing device for cleaning the processing-liquid supply line 92. The processing-liquid supply line 92 shown in FIG. 5 is an example of a processing-liquid supply line for supplying the polishing liquid (slurry) as the processing liquid to the polishing-liquid supply nozzle 50 of the polishing unit 14a. Processing-liquid supply lines for supplying the polishing liquid as the processing liquid to the polishing units 14b to 14d have the same configuration as the processing-liquid supply line 92. The processing-liquid supply line 92 is installed in the housing 10 of the substrate processing apparatus 1.

In the following descriptions, the polishing liquid is referred to as processing liquid, and the polishing-liquid supply nozzle is referred to as processing-liquid supply nozzle. As shown in FIG. 5, the substrate processing apparatus 1 includes the processing-liquid supply line 92 for supplying the processing liquid to the processing-liquid supply nozzle 50. One end of the processing-liquid supply line 92 is coupled to the processing-liquid supply nozzle 50, and other end of the processing-liquid supply line 92 is coupled to a distribution line 93 provided outside the substrate processing apparatus 1. The processing-liquid supply line 92 and the distribution line 93 are coupled to each other by a coupling member 114. The coupling member 114 is mounted to the housing 10 of the substrate processing apparatus 1. The distribution line 93 couples a processing-liquid circulation line 97, serving as a processing liquid supply source, to the processing-liquid supply line 92. The processing-liquid circulation line 97 is installed in a factory in which the substrate processing apparatus 1 is installed. The processing liquid circulates in the factory through the processing-liquid circulation line 97. A part of the processing liquid, which circulates through the processing-liquid circulation line 97, flows into the distribution line 93, and is thus introduced into the substrate processing apparatus 1. The processing liquid is further delivered to the processing-liquid supply nozzle 50 through the processing-liquid supply line 92.

A filter 94 for capturing coarse particles contained in the processing liquid is attached to the distribution line 93. This filter 94 is configured to capture the coarse particles each having not less than a predetermined size. The processing liquid passes through the filter 94, and thereafter flows into the processing-liquid supply line 92. In this embodiment, the filter 94 is located outside the substrate processing apparatus 1. Alternatively, the filter 94 may be located inside the substrate processing apparatus 1. In other words, the filter 94 may be attached to the processing-liquid supply line 92.

The flushing device is a cleaning device for cleaning insides of the distribution line 93 and the processing-liquid supply line 92 with use of a cleaning liquid. The flushing device includes a cleaning-liquid supply line 99 for supplying the cleaning liquid into the processing-liquid supply line 92 through the distribution line 93, and a drain mechanism 101 for directing the cleaning liquid, which has been supplied into the processing-liquid supply line 92, to a drain (or a liquid disposal area) 100 which is located outside the polishing pad 41. The cleaning liquid is a flushing fluid for removing the processing liquid remaining in the distribution line 93 and the processing-liquid supply line 92 by flushing in the distribution line 93 and the processing-liquid supply line 92. More specifically the cleaning liquid is supplied into the distribution line 93 to flow in the distribution line 93 at a flow velocity higher than that of the processing liquid, and further flows in the processing-liquid supply line 92.

A supply switching valve 104, which allows either the processing liquid or the cleaning liquid to flow in the distribution line 93 and the processing-liquid supply line 92, is attached to the distribution line 93 and the cleaning-liquid supply line 99. The cleaning-liquid supply line 99 is coupled to the distribution line 93 through the supply switching valve 104. The supply switching valve 104 is arranged upstream of the filter 94. The supply switching valve 104 in an initial state opens the distribution line 93 while closing the cleaning-liquid supply line 99, to allow the processing liquid to flow through the distribution line 93 into the processing-liquid supply line 92.

When the supply switching valve 104 is operated, the supply switching valve 104 couples the cleaning-liquid supply line 99 to the distribution line 93 while blocking the hydraulic connection between the distribution line 93 and the processing-liquid circulation line 97, thereby allowing the cleaning liquid to flow into the processing-liquid supply line 92 through the cleaning-liquid supply line 99 and the distribution line 93. A three-way valve or a combination of on-off valves is used as the supply switching valve 104. The cleaning-liquid supply line 99 and the supply switching valve 104 are located outside the substrate processing apparatus 1, while the drain mechanism 101 is located inside the substrate processing apparatus 1. The supply switching valve 104 may preferably be located right downstream of a connection point of the processing-liquid circulation line 97 and the distribution line 93. Such an arrangement can enable the cleaning liquid to flow in a most part of the distribution line 93.

The drain mechanism 101 includes a drain line 110 which branches off from the processing-liquid supply line 92 and extends to the drain 100, and a drain switching valve 107 attached to the processing-liquid supply line 92 and the drain line 110. The drain switching valve 107 is located downstream of the coupling member 114. The drain switching valve 107 may preferably be located right downstream of the coupling member 114.

The drain switching valve 107 is configured to direct the cleaning liquid, which flows in the processing-liquid supply line 92, to the drain line 110. More specifically, the drain switching valve 107 in an initial state provides fluid communication between an upstream passage and a downstream passage of the processing-liquid supply line 92 while closing the drain line 110, thereby allowing the processing liquid to flow through the processing-liquid supply line 92 into the processing-liquid supply nozzle 50. When the drain switching valve 107 is operated, the drain switching valve 107 couples the drain line 110 to the upstream passage of the processing-liquid supply line 92 while closing the downstream passage of the processing-liquid supply line 92, thereby directing the processing liquid, which flows in the processing-liquid supply line 92, to the drain line 110. In FIG. 5, the drain switching valve 107 is located downstream of the filter 94. However, the position of the drain switching valve 107 is not limited to this embodiment. For example, the filter 94 may be located right upstream of the processing-liquid supply nozzle 50. A three-way valve or a combination of on-off valves is used as the drain switching valve 107.

The cleaning liquid (i.e., flushing fluid) flows in the distribution line 93 to wash away the processing liquid remaining in the distribution line 93. The cleaning liquid (i.e., flushing fluid) further flows in the processing-liquid supply line 92 to wash away the processing liquid remaining in the processing-liquid supply line 92. In this manner, the cleaning liquid can remove the deteriorated processing liquid remaining in the distribution line 93 and the processing-liquid supply line 92, and can further clean the insides of the distribution line 93 and the processing-liquid supply line 92. The processing liquid, together with the cleaning liquid, flows through the drain line 110 and is then drained (or discarded) into the drain 100.

In a case where the insides of the distribution line 93 and the processing-liquid supply line 92 are not too dirty, a fresh processing liquid may be supplied from the processing-liquid circulation line 97 into the distribution line 93 so as to wash away the remaining old processing liquid. However, introducing the old processing liquid from the outside to the inside of the substrate processing apparatus 1 is undesirable from a standpoint of keeping the inside of the substrate processing apparatus 1 clean. Accordingly, the drain switching valve 107 and the drain 100 are arranged near the coupling member 114 which couples the processing-liquid supply line 92 to the distribution line 93. When the old processing liquid is to be washed away by the fresh processing liquid, the drain switching valve 107 is operated such that the upstream passage of the processing-liquid supply line 92 is coupled to the drain line 110. After the fresh processing liquid flows into the substrate processing apparatus 1, the processing liquid is immediately directed to the drain line 110, and is drained (or discarded) into the drain 100. Therefore, the inside of the substrate processing apparatus 1 can be kept clean.

The fresh processing liquid only sweeps away the old processing liquid, and is not expected to sufficiently clean the insides of the processing-liquid supply line 92 and the distribution line 93. Thus, in a case where the insides of the processing-liquid supply line 92 and the distribution line 93 are very dirty, the drain switching valve 107 and the supply switching valve 104 are operated to introduce the cleaning liquid into the distribution line 93. The cleaning liquid flows in the distribution line 93 and the processing-liquid supply line 92 to clean the insides of these lines, and is then drained (or discarded) through the drain line 110 into the drain 100. In this case also, the cleaning liquid and the old processing liquid are directed to the drain line 110 immediately after flowing into the substrate processing apparatus 1. Therefore, the inside of the substrate processing apparatus 1 is not contaminated by the old processing liquid.

The operations of the drain switching valve 107 and the supply switching valve 104 are controlled by an operation controller 30. The operation controller 30 may be integral with the processing controller 29 of the substrate processing apparatus 1. When the insides of the distribution line 93 and the processing-liquid supply line 92 are to be cleaned, the operation controller 30 operates the supply switching valve 104 and the drain switching valve 107 to provide fluid communication between the cleaning-liquid supply line 99 and the distribution line 93 while providing fluid communication between the drain line 110 and the processing-liquid supply line 92. The cleaning liquid is supplied from the cleaning-liquid supply line 99 into the distribution line 93 through the supply switching valve 104, and flows in the distribution line 93 and the processing-liquid supply line 92 in this order. Further, the cleaning liquid flows through the drain switching valve 107 and the drain line 110, and is then drained (discarded) into the drain 100. In this manner, the cleaning liquid is directly led to the drain 100 without being supplied onto the polishing pad 41. The drain 100 is an example of the liquid disposal area. The liquid disposal area may be a structure to which the processing liquid can be discarded.

A pure-water switching valve 112 is attached to the processing-liquid supply line 92. A pure-water supply line 113 is coupled to the pure-water switching valve 112. The pure-water switching valve 112 is located downstream of the drain switching valve 107. The pure-water switching valve 112 is preferably located right downstream of the drain switching valve 107. Operation of the pure-water switching valve 112 is controlled by the operation controller 30.

When the pure-water switching valve 112 is operated, the upstream passage of the processing-liquid supply line 92 is closed, while the pure-water supply line 113 is coupled to the downstream passage of the processing-liquid supply line 92. Pure water, which serves as a cleaning liquid, is supplied into the processing-liquid supply line 92 through the pure-water supply line 113, and flows in the processing-liquid supply line 92, and is then supplied from the processing-liquid supply nozzle 50 onto the polishing pad 41. The pure water is regularly (e.g., every time processing of a wafer is performed) supplied to the processing-liquid supply nozzle 50 through the processing-liquid supply line 92. Therefore, the processing liquid does not remain in the processing-liquid supply line 92, extending from the pure-water switching valve 112 to the processing-liquid supply nozzle 50, and in the processing-liquid supply nozzle 50.

The cleaning liquid flushes in the distribution line 93 and the processing-liquid supply line 92, thereby washing away the deteriorated processing liquid into the drain 100. The processing liquid that has stayed in the distribution line 93 and the processing-liquid supply line 92 for a long time may have a concentration distribution that has changed greatly from an original concentration distribution, and may further contain coarse particles which have been formed from condensed fine particles (typically abrasive grains). Such processing liquid is directly drained into the drain 100 without being supplied onto the polishing pad 41. Therefore, the processing liquid, whose property has changed, does not adversely affect polishing of the wafer.

Examples of the cleaning liquid (i.e., flushing fluid), which is used for cleaning the distribution line 93 and the processing-liquid supply line 92, include pure water, an etching liquid, an aqueous solution containing a chelating agent, a liquid having a zeta potential effect, and a liquid to which an ultrasonic vibration has been applied. If an acid cleaning liquid or an alkaline cleaning liquid is attached to members, such as the polishing pad 41, the top ring 43, the dresser 56, and the roll sponges 77, 78, these members may be contaminated. According to this embodiment, because the cleaning liquid is drained into the drain 100 located outside the polishing pad 41, the cleaning liquid is not attached to these members.

A transfer line 111 for directing the cleaning liquid and the processing liquid that have been drained into the drain 100 to the outside of the substrate processing apparatus 1 may be provided. The transfer line 111 extends from the drain 100 to the outside of the substrate processing apparatus 1, so that the cleaning liquid and the processing liquid that have been drained into the drain 100 are discharged to the outside of the substrate processing apparatus 1 through the transfer line 111. Therefore, it is possible to prevent the cleaning liquid and the processing liquid from contaminating the inside of the substrate processing apparatus 1.

Cleaning of the distribution line 93 and the processing-liquid supply line 92 is performed before processing of a wafer is performed, i.e., before polishing of a wafer is performed. For example, the cleaning liquid is supplied at an idling time of the substrate processing apparatus 1 or when an operation time of the substrate processing apparatus 1 has reached a predetermined time. Therefore, the old processing liquid remaining in the distribution line 93 and the processing-liquid supply line 92 is removed, and the fresh processing liquid, which can exhibit its original property, is supplied onto the polishing pad 41 through the distribution line 93 and the processing-liquid supply line 92. The operation controller 30 may operate the drain switching valve 107 and the supply switching valve 104 at an idling time of the substrate processing apparatus 1 or when the operation time of the substrate processing apparatus 1 has reached a predetermined time so as to automatically supply the cleaning liquid into the distribution line 93 and the processing-liquid supply line 92.

In order to keep the distribution line 93 and the processing-liquid supply line 92 clean by removing the cleaning liquid from the distribution line 93 and the processing-liquid supply line 92, it is desirable to replace the cleaning liquid in these lines 92, 93 with pure water. Thus, a pure-water supply line 116 is coupled to the cleaning-liquid supply line 99. A pure-water switching valve 117 is attached to the cleaning-liquid supply line 99. The pure-water supply line 116 is coupled to the cleaning-liquid supply line 99 through the pure-water switching valve 117.

When the pure-water switching valve 117, the supply switching valve 104, and the drain switching valve 107 are operated, pure water is supplied into the distribution line 93 through the pure-water supply line 116 and the cleaning-liquid supply line 99. The pure water flows through the distribution line 93 into the processing-liquid supply line 92, and further flows through the drain switching valve 107 and the drain line 110 and is then drained into the drain 100. In this manner, the pure water removes the cleaning liquid from the insides of the distribution line 93 and the processing-liquid supply line 92, whereby the insides of the distribution line 93 and the processing-liquid supply line 92 can be kept clean.

Figure 6:
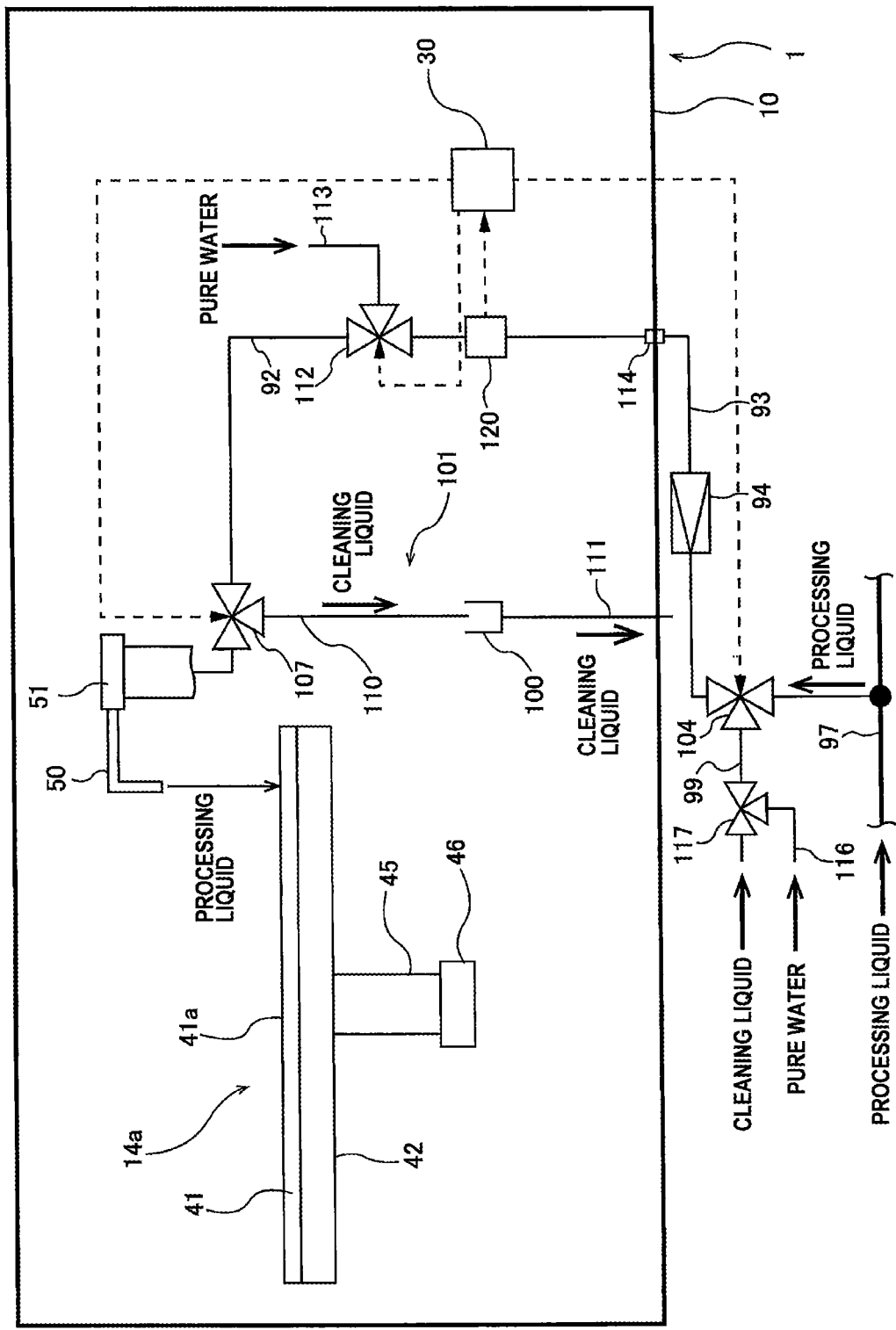
FIG. 6 is a view showing another embodiment of the flushing device.

FIG. 6 is a view showing another embodiment of the flushing device. With reference to the construction of this embodiment which is the same as those of the embodiment in FIG. 5, a duplicate description thereof will be omitted. In this embodiment, as shown in FIG. 6, the drain switching valve 107 is located right upstream of the processing-liquid supply nozzle 50. This arrangement can enable the cleaning liquid to flow through the distribution line 93 and a most part of the processing-liquid supply line 92, and can therefore clean the distribution line 93 and a most part of the processing-liquid supply line 92 with the cleaning liquid.

After the distribution line 93 and the processing-liquid supply line 92 are cleaned, it is desirable to replace the cleaning liquid in the distribution line 93 and the processing-liquid supply line 92 with pure water. When the pure-water switching valve 117, the supply switching valve 104, and the drain switching valve 107 are operated, the pure water is supplied into the distribution line 93 through the pure-water supply line 116 and the cleaning-liquid supply line 99. The pure water flows through the distribution line 93 into the processing-liquid supply line 92, and further flows through the drain switching valve 107 and the drain line 110 and is then drained into the drain 100. A fluid mixture of the cleaning liquid and the pure water may be supplied into the distribution line 93 before the pure water is supplied.

It is desirable to replace the processing liquid in the processing-liquid supply nozzle 50 and the processing-liquid supply line 92 with pure water after the processing liquid has been supplied from the processing-liquid supply nozzle 50 for wafer processing. When the pure-water switching valve 112 is operated, the pure water is supplied through the pure-water supply line 113 into the processing-liquid supply line 92, flows in the processing-liquid supply line 92, and is supplied from the processing-liquid supply nozzle 50 onto the polishing pad 41. In this manner, the processing liquid in the processing-liquid supply nozzle 50 and the processing-liquid supply line 92 are replaced with the pure water after wafer processing. Accordingly, the residence and the condensation of the processing liquid in the processing-liquid supply nozzle 50 and the processing-liquid supply line 92 are prevented. The drain switching valve 107 is located downstream of the pure-water switching valve 112. Therefore, the pure water can remove the cleaning liquid from the entirety of the processing-liquid supply line 92.

Figure 7:
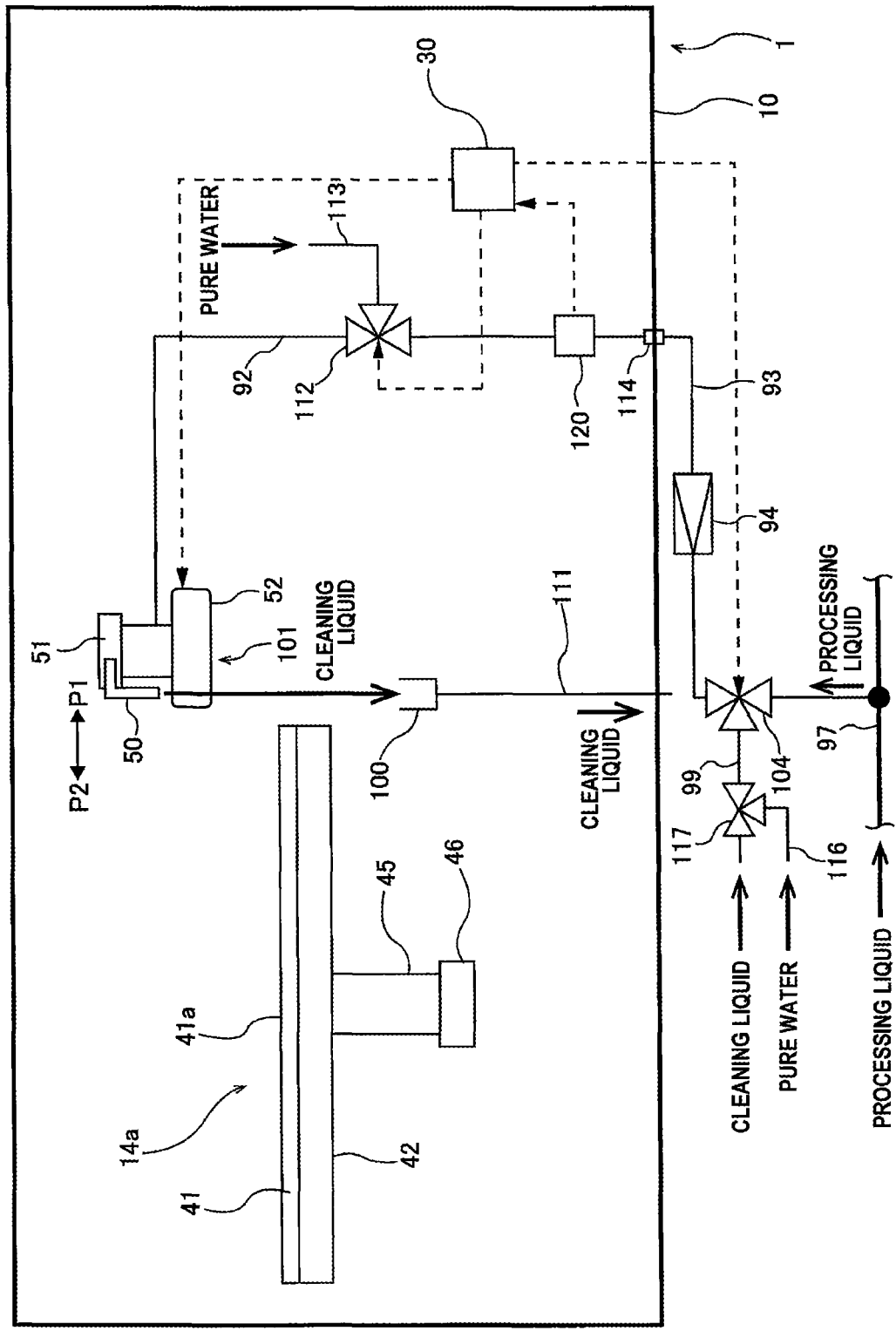
FIG. 7 is a view showing still another embodiment of the flushing device.

FIG. 7 is a view showing still another embodiment of the flushing device. With reference to the construction of this embodiment which is the same as those of the embodiment in FIG. 5, a duplicate description thereof will be omitted. In this embodiment, the drain mechanism 101 comprises the nozzle motor 52 as the nozzle moving mechanism which is configured to move the processing-liquid supply nozzle 50 from the processing position P2 located above the polishing pad 41 to the retreat position P1 located above the drain 100 (see FIG. 3 for details of the retreat position P1 and the processing position P2). In this embodiment, the above-described drain switching valve 107 and the drain line 110 are not provided. The drain 100 is provided below the processing-liquid supply nozzle 50 that has been moved to the retreat position P1.

Operation of the nozzle motor 52 is controlled by the operation controller 30. Specifically, the operation controller 30 operates the nozzle motor 52 before polishing of the wafer W to move the processing-liquid supply nozzle 50 to the retreat position P1 above the drain 100. Thereafter, the supply switching valve 104 is operated to allow the cleaning liquid (or the pure water) to flow through the distribution line 93 into the processing-liquid supply line 92. The processing liquid remaining in the distribution line 93 and the processing-liquid supply line 92 is drained, together with the cleaning liquid (or the pure water), from the processing-liquid supply nozzle 50 into the drain 100, without being supplied onto the polishing pad 41. According to this embodiment, the cleaning liquid (or the pure water) can flow through the entirety of the processing-liquid supply line 92 and the processing-liquid supply nozzle 50, so that the entirety of the processing-liquid supply line 92 and the processing-liquid supply nozzle 50 can be cleaned with the cleaning liquid (or the pure water).

It is preferable that a distance between the coupling member 114 and the processing-liquid supply nozzle 50 be as short as possible. However, for the convenience of an installation space, it may be difficult to attach the drain switching valve 107 to the processing-liquid supply line 92. In this embodiment, because the drain mechanism 101 is composed of the nozzle motor 52, the drain switching valve 107 is not necessary.

The filter 94 is configured to capture the coarse particles contained in the processing liquid. If the filter 94 is clogged, a pressure at an inflow side of the filter 94 increases, thereby pushing out a lot of particles from the filter 94. The processing liquid, containing a lot of particles, may cause a serious damage to a wafer. Therefore, it is necessary to replace the filter 94 before the filter 94 is clogged. In order to detect clogging of the filter 94, a flow meter or a pressure gauge may be used. However, although the flow meter and the pressure gauge can detect clogging of the filter 94, it is difficult to predict clogging of the filter 94. Therefore, in order to predict clogging of the filter 94, as shown in FIGS. 5 through 7, the flushing device includes a particle measuring device 120 which is configured to count particles contained in the processing liquid flowing in the processing-liquid supply line 92.

The particle measuring device 120 is configured to measure a size of a particle and count particles contained in the processing liquid per unit volume for each size of the particles. The particle measuring device 120 is attached to the processing-liquid supply line 92, and is arranged downstream of the filter 94. The particle measuring device 120 is coupled to the operation controller 30, and is configured to send the number of particles to the operation controller 30. The particle measuring device 120 may be called a particle monitor. The particle measuring device 120 is disposed in the substrate processing apparatus 1 in FIGS. 5 through 7, while the particle measuring device 120 may be attached to the distribution line 93.

The operation controller 30 predicts clogging of the filter 94 based on the number of particles. As described above, if the filter 94 starts to be clogged, the number of particles contained in the processing liquid that has passed through the filter 94 increases. When the number of particles contained in the processing liquid per unit volume has reached a predetermined threshold value, the operation controller 30 emits an alarm for prompting a replacement of the filter 94. Therefore, the filter 94 can be changed before the filter 94 is clogged.

If the number of particles has reached a threshold value, the operation controller 30 may operate the supply switching valve 104 to cause the cleaning liquid to flow into the distribution line 93 and the processing-liquid supply line 92, while operating the drain mechanism 101 to direct the cleaning liquid, together with the processing liquid, to the drain 100. Further, if the number of particles has reached a threshold value, the operation controller 30 may emit an alarm and/or may stop the operation of the substrate processing apparatus 1.

If a measurement value of the size of the particle has reached a predetermined threshold value, the operation controller 30 may operate the supply switching valve 104 to cause the cleaning liquid to flow into the distribution line 93 and the processing-liquid supply line 92, while operating the drain mechanism 101 to direct the cleaning liquid, together with the processing liquid, to the drain 100. Further, if a measurement value of the size of the particle has reached a predetermined threshold value, the operation controller 30 may emit an alarm and/or may stop the operation of the substrate processing apparatus 1.

The film-thickness measuring device 21 (see FIG. 1) is coupled to the operation controller 30. The film-thickness measuring device 21 is configured to send a measurement value of a film thickness of a wafer to the operation controller 30. If the measurement value of the film thickness is out of a predetermined allowable range, the operation controller 30 may operate the supply switching valve 104 to cause the cleaning liquid to flow through the distribution line 93 into the processing-liquid supply line 92, while operating the drain mechanism 101 to direct the cleaning liquid, which has been supplied to the processing-liquid supply line 92, to the drain 100. If the measurement value of the film thickness is out of a predetermined allowable range, the operation controller 30 may emit an alarm and/or may stop the operation of the substrate processing apparatus 1.

The film-thickness measuring device 21 shown in FIG. 1 is a so-called inline-type film-thickness measuring device which is incorporated in the substrate processing apparatus 1. Alternatively, the film-thickness measuring device 21 may be a standalone-type external film-thickness measuring device which is installed outside the substrate processing apparatus 1. The operation controller 30 calculates a polishing rate of a wafer from an initial value of the film thickness, a measurement value of the film thickness, and a polishing time. If the polishing rate is out of a predetermined allowable range, the operation controller 30 may operate the supply switching valve 104 to cause the cleaning liquid to flow through the distribution line 93 into the processing-liquid supply line 92, while operating the drain mechanism 101 to direct the cleaning liquid, which has been supplied to the processing-liquid supply line 92, to the drain 100. If the polishing rate is out of a predetermined allowable range, the operation controller 30 may emit an alarm and/or may stop the operation of the substrate processing apparatus 1.

Figure 8:
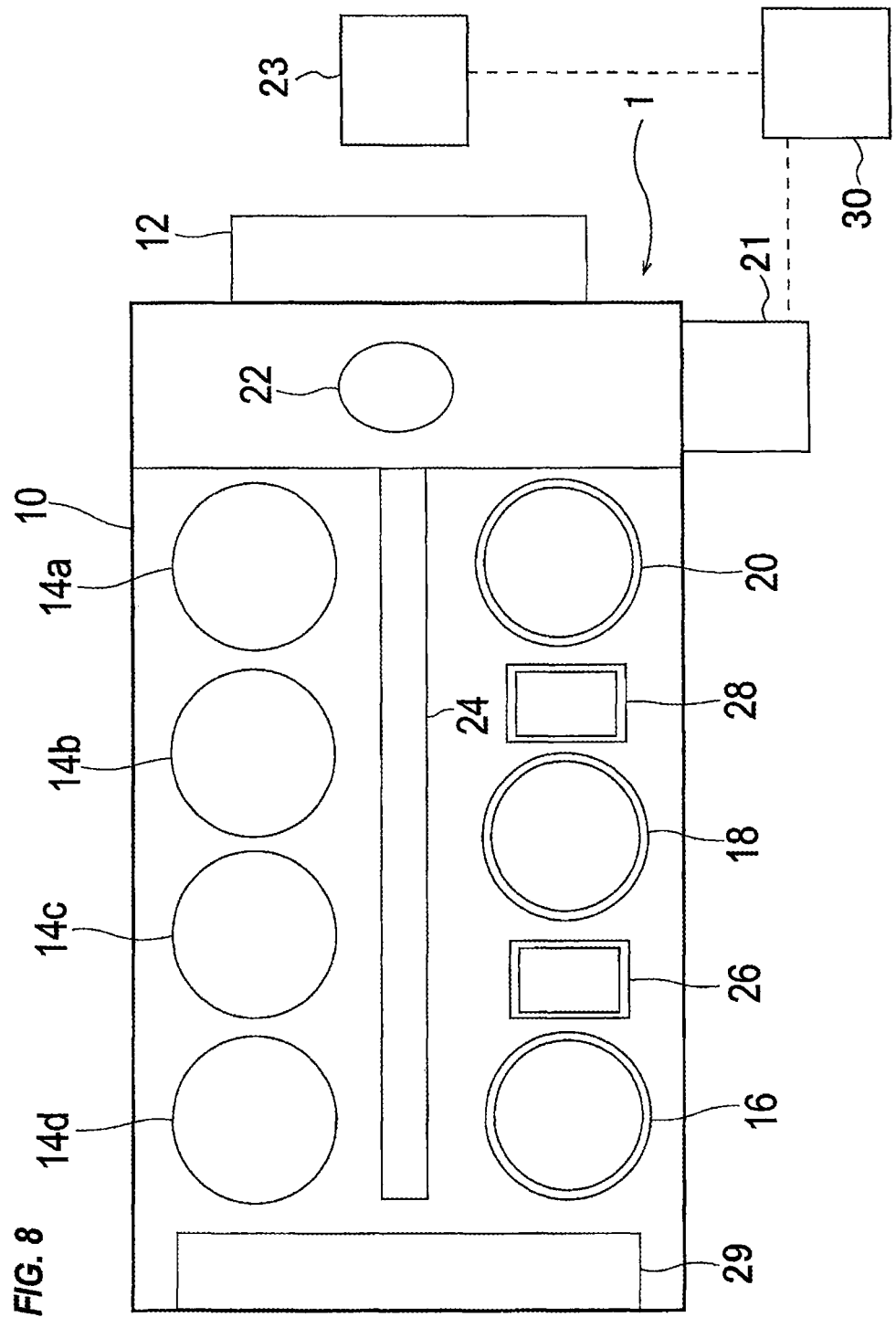
FIG. 8 is a schematic view showing an embodiment in which a defect inspection device is provided outside the substrate processing apparatus.

FIG. 8 is a schematic view showing an example in which a defect inspection device 23 is provided outside the substrate processing apparatus 1. The defect inspection device 23 is configured to detect defects (e.g., scratches formed on a surface of a wafer and foreign matters attached to the surface of the wafer) and count the defects. One example of the defect inspection device 23 is a light-scattering type defect inspection device which is configured to irradiate a surface of a wafer with ray of light (e.g., visible ray, infrared ray, ultraviolet ray) and detect scratches on the surface of the wafer based on scattered light from the surface of the wafer. An increase in particles contained in the processing liquid may cause scratches on a surface of a wafer. Thus, the wafer that has been processed in the substrate processing apparatus 1 is transported to the defect inspection device 23, and the scratches on the surface of the wafer are detected by the defect inspection device 23.

The defect inspection device 23 is coupled to the operation controller 30, so that the number of detected scratches is sent to the operation controller 30. If the number of detected scratches has reached a predetermined threshold value, the operation controller 30 may operate the supply switching valve 104 to cause the cleaning liquid to flow through the distribution line 93 into the processing-liquid supply line 92, while operating the drain mechanism 101 to direct the cleaning liquid, which has been supplied to the processing-liquid supply line 92, to the drain 100. If the number of detected scratches has reached a predetermined threshold value, the operation controller 30 may emit an alarm and/or may stop the operation of the substrate processing apparatus 1.

Figure 9:
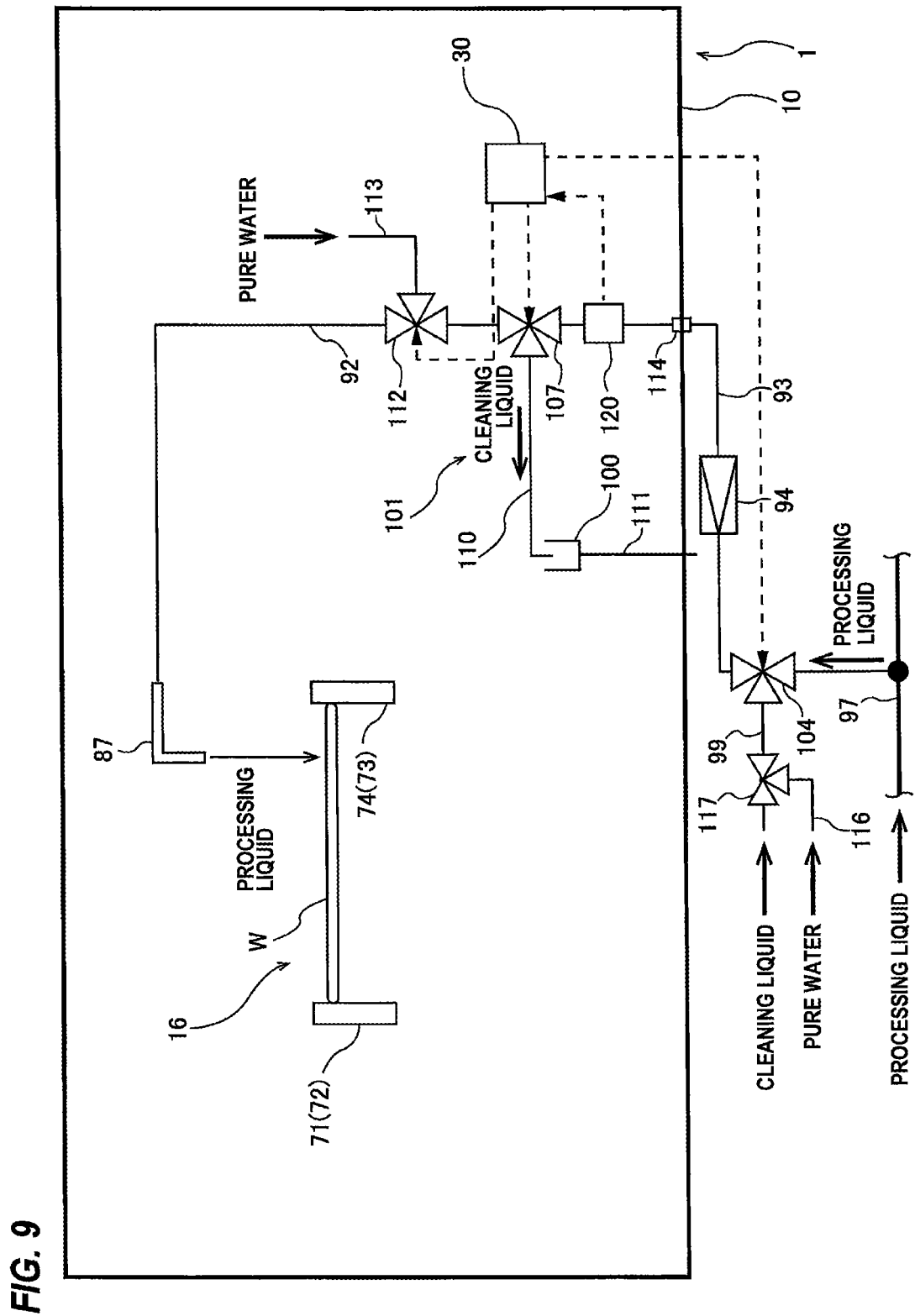
FIG. 9 is a schematic view showing still another embodiment of the flushing device.
Figure 10:
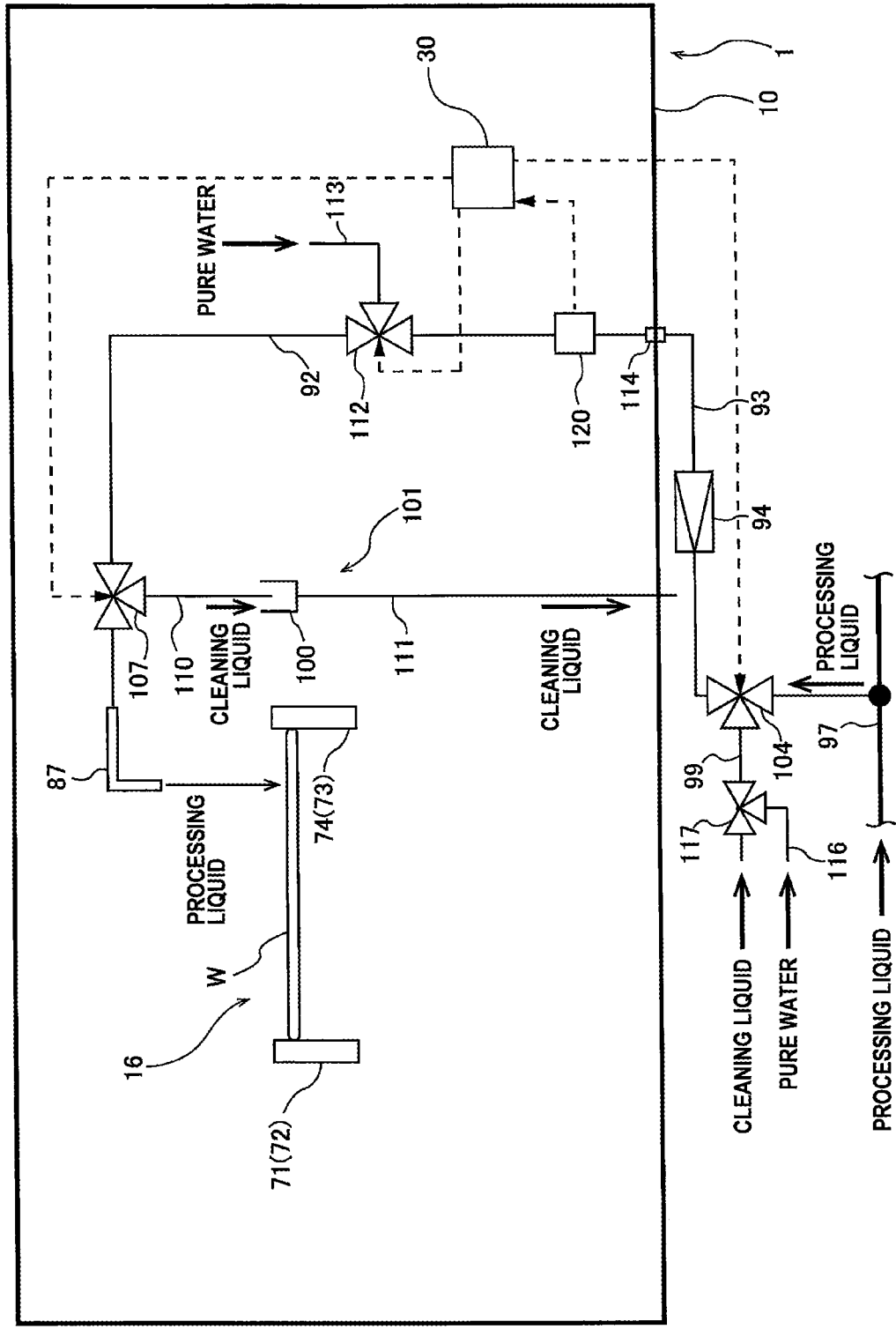
FIG. 10 is a schematic view showing still another embodiment of the flushing device.
Figure 11:
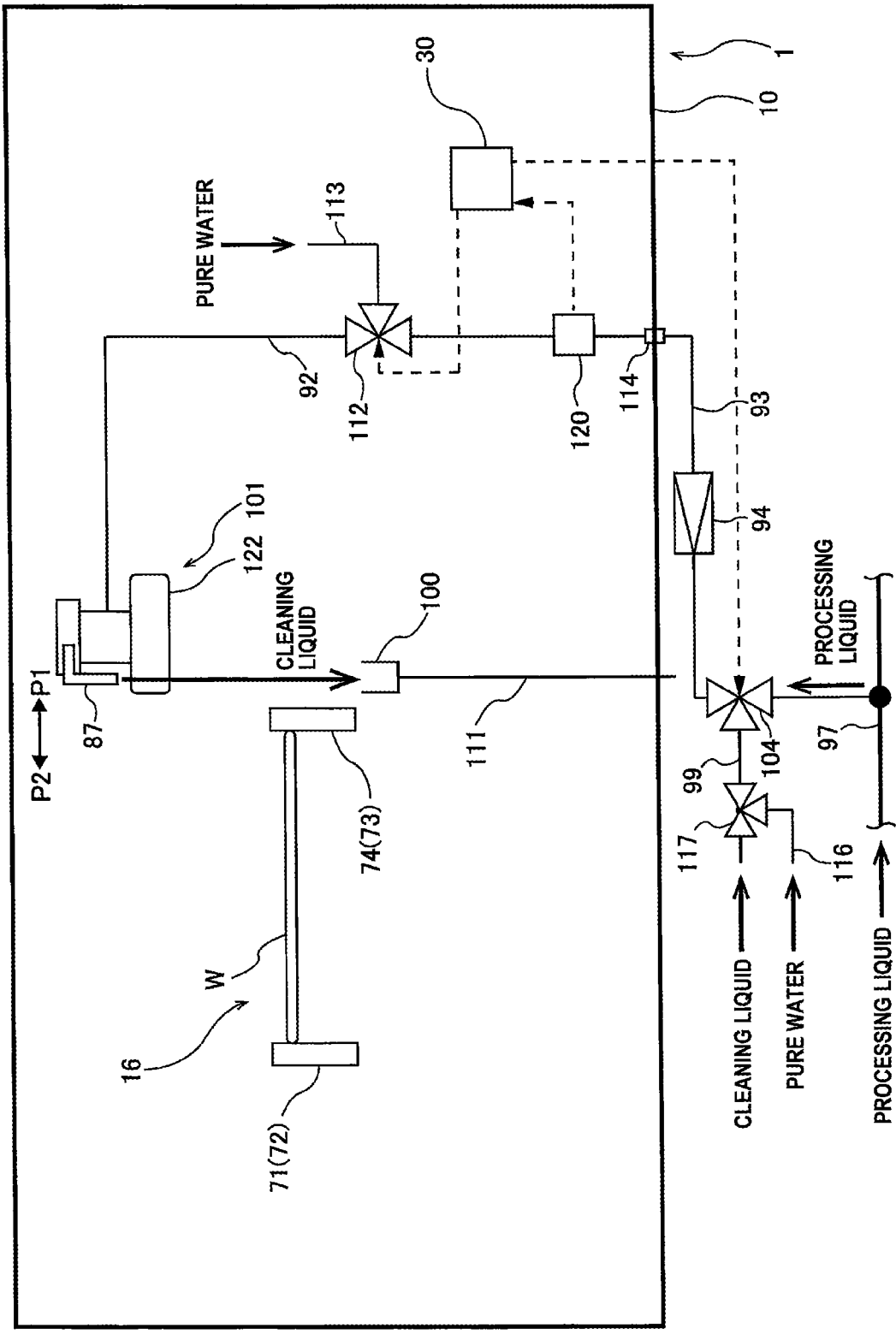
FIG. 11 is a schematic view showing still another embodiment of the flushing device.

FIG. 9, FIG. 10, and FIG. 11 are schematic views each showing a processing-liquid supply system for supplying a chemical liquid as a processing liquid to the cleaning unit 16. The processing-liquid supply systems shown in FIG. 9, FIG. 10, and FIG. 11 have basically the same structures as processing-liquid supply systems shown in FIG. 5, FIG. 6, and FIG. 7. Embodiments shown in FIG. 9, FIG. 10, and FIG. 11 correspond to the embodiments shown in FIG. 5, FIG. 6, and FIG. 7, respectively. In FIG. 11, the upper chemical liquid supply nozzle 87 and the lower chemical liquid supply nozzle (not shown) are configured to be movable between retreat position P1 outside a wafer W and processing position P2 above the wafer W by an upper nozzle motor 122 and a lower nozzle motor which is not shown. In the embodiment shown in FIG. 11, the drain mechanism 101 is composed of the upper nozzle motor 122 and the not-shown lower nozzle motor.

As shown in FIGS. 9 through 11, the drain 100, which is an example of the liquid disposal area, is located outside the holding rollers 71, 72, 73, 74 which constitute the substrate holder for holding the wafer W. Therefore, when the drain mechanism 101 is operated, the cleaning liquid and the processing liquid (chemical liquid) that have flowed in the processing-liquid supply line 92 are directly led to the drain 100 without being supplied onto the wafer W.

While the present invention has been described with reference to the embodiments thereof, it should be understood that the present invention is not limited to the particular embodiments described above and that other modifications may be made within the technical concept of the present invention.

INDUSTRIAL APPLICABILITY

The present invention is applicable to a substrate processing system and a substrate processing method capable of cleaning a processing-liquid supply line.

REFERENCE SIGNS LIST 1 substrate processing apparatus
10 housing
12 loading port
14a through 14d polishing unit
16 first cleaning unit 18 second cleaning unit
20 drying unit
21 film-thickness measuring device
22 first substrate transfer robot
23 defect inspection device
24 substrate transport unit
26 second substrate transfer robot
28 third substrate transfer robot
29 processing controller
30 operation controller
41 polishing pad
42 polishing table
43 top ring (substrate holder)
45 table shaft
46 table motor
47 top ring shaft
48 top ring arm
50 polishing-liquid supply nozzle (processing-liquid supply nozzle)
51 nozzle pivot shaft
52 nozzle motor
54 dressing device
56 dresser
57 dresser arm
71 through 74 holding roller (substrate holder)
75 substrate rotating device
77, 78 roll sponge
80, 81 cleaning-tool rotating device
82 elevating mechanism
85 rinsing liquid supply nozzle
87 chemical liquid supply nozzle (processing-liquid supply nozzle)
89 guide rail
92 processing-liquid supply line
93 distribution line
94 filter
97 processing-liquid circulation line
100 drain (liquid disposal area)
101 drain mechanism
104 supply switching valve
107 drain switching valve
110 drain line
111 transfer line
112 pure-water switching valve
113 pure-water supply line
114 coupling member
116 pure-water supply line
117 pure-water switching valve
120 particle measuring device
122 upper nozzle motor

The invention claimed is:

1. A substrate processing system comprising:
   a substrate processing apparatus configured to process a substrate while directly or indirectly supplying a processing liquid from a processing-liquid supply nozzle onto the substrate, the processing-liquid supply nozzle being coupled to a processing-liquid supply line;
   a distribution line that couples the processing-liquid supply line to a processing-liquid supply source; and
   a flushing device configured to clean the distribution line and the processing-liquid supply line, the flushing device including:
      a cleaning-liquid supply line coupled to the distribution line;
      a drain mechanism configured to direct a cleaning liquid, supplied into the processing-liquid supply line through the distribution line, to a liquid disposal area;
      a supply switching valve attached to the distribution line and the cleaning-liquid supply line, the supply switching valve being configured to allow only the processing liquid or the cleaning liquid to flow into the distribution line; and
      an operation controller configured to control operations of the drain mechanism and the supply switching valve,
   wherein the distribution line and the supply switching valve are located outside the substrate processing apparatus,
   wherein the drain mechanism comprises a drain line which branches off from the processing-liquid supply line and extends to the liquid disposal area, and a drain switching valve attached to the processing-liquid supply line and the drain line, the drain switching valve being configured to direct the cleaning liquid, flowing in the processing-liquid supply line, into the drain line, and
   wherein the drain switching valve is located downstream of the supply switching valve.

2. The substrate processing system according to claim 1, wherein the drain switching valve is located upstream of the processing-liquid supply nozzle.

3. The substrate processing system according to claim 1, wherein the drain mechanism comprises a nozzle moving mechanism configured to move the processing-liquid supply nozzle from a predetermined position for processing the substrate to a position above the liquid disposal area.

4. The substrate processing system according to claim 1, wherein the operation controller is configured to operate the supply switching valve before processing of the substrate to pass the cleaning liquid into the processing-liquid supply line.

5. The substrate processing system according to claim 1, wherein the operation controller is configured to operate the supply switching valve and the drain mechanism to direct the cleaning liquid to the liquid disposal area while passing the cleaning liquid into the processing-liquid supply line when an operation time of the substrate processing apparatus has reached a predetermined time.

6. The substrate processing system according to claim 1, further comprising:
   a particle measuring device configured to count particles contained in the processing liquid per unit volume.

7. The substrate processing system according to claim 6, wherein the operation controller is configured to emit an alarm or stop an operation of the substrate processing apparatus if the number of particles has reached a predetermined threshold value.

8. The substrate processing system according to claim 6, wherein the operation controller is configured to operate the supply switching valve to cause the cleaning liquid to flow through the distribution line into the processing-liquid supply line and operate the drain mechanism to direct the cleaning liquid, supplied in the processing-liquid supply line, to the liquid disposal area, if the number of particles has reached a predetermined threshold value.

9. The substrate processing system according to claim 6, further comprising:
   a filter for capturing the particles contained in the processing liquid, the particle measuring device being located downstream of the filter.

10. The substrate processing system according to claim 9, wherein the operation controller is configured to emit an alarm prompting a replacement of the filter if the number of particles has reached a predetermined threshold value.

11. The substrate processing system according to claim 1, further comprising:
a film-thickness measuring device configured to measure a film thickness of the substrate,
wherein the operation controller is configured to operate the supply switching valve to cause the cleaning liquid to flow through the distribution line into the processing-liquid supply line and operate the drain mechanism to direct the cleaning liquid, supplied in the processing-liquid supply line, to the liquid disposal area, if a measurement value of the film thickness is out of a predetermined allowable range.

12. The substrate processing system according to claim 1, further comprising:
a substrate inspection device configured to detect a defect of the substrate,
wherein the operation controller is configured to operate the supply switching valve to cause the cleaning liquid to flow through the distribution line into the processing-liquid supply line and operate the drain mechanism to direct the cleaning liquid, supplied in the processing-liquid supply line, to the liquid disposal area, if the number of detected defects has reached a predetermined threshold value.

13. The substrate processing system according to claim 1, wherein the drain mechanism is located inside the substrate processing apparatus.

14. The substrate processing system according to claim 1, wherein the drain switching valve is located downstream of a coupling member configured to couple the processing-liquid supply line and the distribution line to each other.

15. The substrate processing system according to claim 1, wherein the operation controller is configured to operate the drain switching valve to couple the drain line to an upstream passage of the processing-liquid supply line while closing a downstream passage of the processing-liquid supply line and wash away the processing liquid remaining in the distribution line by supplying a fresh processing liquid into the distribution line to direct the processing liquid to the liquid disposal area through the drain line.

16. The substrate processing system according to claim 1, wherein the drain switching valve is connected in-line with processing-liquid supply line.

17. A substrate processing method comprising:
cleaning a distribution line and a processing-liquid supply line by operating a supply switching valve attached to the distribution line and a cleaning-liquid supply line and a drain switching valve located downstream of the supply switching valve and by flushing a cleaning liquid through the distribution line into the processing-liquid supply line which is installed in a substrate processing apparatus, while directing the cleaning liquid, which has been supplied into the processing-liquid supply line, to a liquid disposal area;
processing a substrate in the substrate processing apparatus while supplying directly or indirectly a processing liquid onto the substrate through the distribution line and the processing-liquid supply line; and
washing away a processing liquid remaining in the distribution line and directing the processing liquid to the liquid disposal area by operating the supply switching valve and the drain switching valve and by supplying a fresh processing liquid into the distribution line.

18. The substrate processing method according to claim 17, further comprising:
measuring the number of particles contained in the processing liquid per unit volume.

19. The substrate processing method according to claim 18, wherein if the number of particles has reached a predetermined threshold value, emitting an alarm or stopping an operation of the substrate processing apparatus.

20. The substrate processing method according to claim 18, further comprising:
if the number of particles has reached a predetermined threshold value, performing again the process of cleaning the distribution line and the processing-liquid supply line by flushing the cleaning liquid through the distribution line into the processing-liquid supply line while directing the cleaning liquid to the liquid disposal area.

21. The substrate processing method according to claim 18, further comprising:
if the number of particles has reached a predetermined threshold value, emitting an alarm for prompting an replacement of a filter attached to the distribution line or the processing-liquid supply line.

22. The substrate processing method according to claim 17, further comprising:
measuring a film thickness of the substrate; and
if a measurement value of the film thickness is out of a predetermined allowable range, performing again the process of cleaning the distribution line and the processing-liquid supply line by flushing the cleaning liquid through the distribution line into the processing-liquid supply line while directing the cleaning liquid to the liquid disposal area.

23. The substrate processing method according to claim 17, further comprising:
detecting a defect of the substrate; and
if the number of detected defects has reached a predetermined threshold value, performing again the process of cleaning the distribution line and the processing-liquid supply line by flushing the cleaning liquid through the distribution line into the processing-liquid supply line while directing the cleaning liquid to the liquid disposal area.

24. The substrate processing method according to claim 17, wherein when an operation time of the substrate processing apparatus has reached a predetermined time, performing the process of cleaning the distribution line and the processing-liquid supply line by flushing the cleaning liquid through the distribution line into the processing-liquid supply line while directing the cleaning liquid, supplied into the processing-liquid supply line, to the liquid disposal area.

25. The substrate processing method according to claim 17, wherein:
the drain switching valve is attached to the processing-liquid supply line and a drain line which branches off from the processing-liquid supply line and extends to the liquid disposal area,
the step of directing the cleaning liquid to the liquid disposal area comprises operating the drain switching valve to couple the drain line to an upstream passage of the processing-liquid supply line while closing a downstream passage of the processing-liquid supply line, and
the step of processing the substrate in the substrate processing apparatus comprises operating the drain switching valve to provide fluid communication between the upstream passage of the processing-liquid supply line and the downstream passage of the processing-liquid supply line while closing the drain line.

26. The substrate processing method according to claim 17, wherein the step of directing the processing liquid to the liquid disposal area comprises operating the drain switching valve attached to a drain line to couple the drain line and an upstream passage of the processing-liquid supply line while closing a downstream passage of the processing-liquid supply line.

27. The substrate processing method according to claim 17, wherein a drain line branches off from the processing-liquid supply line and extends to the liquid disposal area, and the drain switching valve is connected in-line with the processing-liquid supply line and configured to direct the cleaning liquid, flowing in the processing-liquid supply line, into the drain line.

* * * * *